(12) United States Patent
Tanzawa

(10) Patent No.: US 9,646,660 B2
(45) Date of Patent: May 9, 2017

(54) SELECTABLE MEMORY ACCESS TIME

(71) Applicant: INTEL CORPORATION, Santa Clara, CA (US)

(72) Inventor: Toru Tanzawa, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 249 days.

(21) Appl. No.: 14/493,682

(22) Filed: Sep. 23, 2014

(65) Prior Publication Data

US 2016/0085444 A1 Mar. 24, 2016

(51) Int. Cl.
*G11C 7/22* (2006.01)
*G11C 7/04* (2006.01)

(52) U.S. Cl.
CPC . *G11C 7/22* (2013.01); *G11C 7/04* (2013.01)

(58) Field of Classification Search
CPC ...... G06F 3/061; G06F 12/00; G06F 17/5031; G06F 13/1689; G06F 3/0611; G06F 3/0634; G06F 3/0673; G06F 9/50; G11C 11/4076; G11C 2207/2254; G11C 29/023; G11C 29/50012
See application file for complete search history.

(56) References Cited

U.S. PATENT DOCUMENTS

| 6,282,137 | B1 * | 8/2001 | Lee | G11C 7/06 365/185.25 |
| 6,314,014 | B1 | 11/2001 | Lowrey et al. | |
| 7,755,961 | B2 | 7/2010 | Rao | |
| 2007/0162715 | A1 * | 7/2007 | Tagawa | G06F 13/1647 711/158 |
| 2008/0091903 | A1 * | 4/2008 | Vergnes | G11C 7/1051 711/167 |
| 2008/0123451 | A1 | 5/2008 | Rao | |
| 2008/0158932 | A1 | 7/2008 | Khellah et al. | |
| 2009/0052266 | A1 | 2/2009 | Askar et al. | |

(Continued)

FOREIGN PATENT DOCUMENTS

| CN | 101506894 A | 8/2009 |
| JP | 02-294856 | 12/1990 |
| TW | 200917012 A | 4/2009 |

OTHER PUBLICATIONS

Baek et al., "Realization of Vertical Resistive Memory (VRRAM) using cost effective 3D Process", IEEE, IEDM11-737, 2011, 4 pages.

(Continued)

*Primary Examiner* — Zhuo Li
(74) *Attorney, Agent, or Firm* — Grossman, Tucker, Perreault & Pfleger, PLLC

(57) ABSTRACT

The present disclosure relates to selectable memory access time. An apparatus includes a memory controller. The memory controller is configured to select a memory access time interval duration parameter based, at least in part, on a memory address identifier, in response to receiving a memory access request; to adjust the selected memory access time interval duration parameter based, at least in part, on a current operating temperature; and perform a requested memory access operation on a memory array, a duration of the memory access operation related to the adjusted memory access time interval duration parameter.

25 Claims, 3 Drawing Sheets

(56) References Cited

U.S. PATENT DOCUMENTS

| | | | |
|---|---|---|---|
| 2009/0146716 A1* | 6/2009 | Ide | G11C 7/1072 |
| | | | 327/276 |
| 2010/0289517 A1 | 11/2010 | Oh et al. | |
| 2011/0305075 A1 | 12/2011 | Lowrey et al. | |
| 2014/0211568 A1 | 7/2014 | Mui et al. | |
| 2014/0241033 A1 | 8/2014 | Gaertner et al. | |

OTHER PUBLICATIONS

Choi et al., "3D Approaches for Non-volatile Memory", Symposium on VLSI Technology Digest of Technical Papers, 2011, pp. 178-179.

Crowley et al., "512Mb PROM with 8 Layers of Antifuse/Diode Cells", ISSCC 2003 / Session 16 / Non-Volatile Memory/Paper 16.4, 2003, 10 pages.

Goda et al., "Scaling Directions for 2D and 3D NAND Cells", IEEE, 2012, 4 pages.

Jang et al., "Vertical Cell Array using TCAT(Terabit Cell Array Transistor) Technology for Ultra High Density NAND Flash Memory", 2009 Symposium on VLSI Technology Digest of Technical Papers, 2009, pp. 192-193.

Johnson et al., "512-Mb PROM With a Three-Dimensional Array of Diode/Antifuse Memory Cells", IEEE Journal of Solid-State Circuits, vol. 38, No. 11, Nov. 2003, pp. 1920-1928.

Katsumata et al., "Pipe-shaped BiCS Flash Memory with 16 Stacked Layers and Multi-Level-Cell Operation for Ultra High Density Storage Devices", 2009 Symposium on VLSI Technology Digest of Technical Papers, 2009, pp. 136-137.

Kim et al., "Multi-Layered Vertical Gate NAND Flash Overcoming Stacking Limit for Terabit Density Storage", 2009 Symposium on VLSI Technology Digest of Technical Papers, 2009, pp. 188-189.

Kim et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, 2009, pp. 186-187.

Kinoshita et al., "Scalable 3-D vertical chain-cell-type phase-change memory with 4F2 poly-Si diodes", IEEE, 2012 Symposium on VLSI Technology Digest of Technical Papers, 2012, pp. 35-36.

International Search Report and Written Opinion from related application PCT/US2015/047645 mailed Dec. 8, 2015.

Chinese Office Action and Search Report issued in Chinese Application No. 104125961, dated Jan. 9, 2017, with English translation of Search Report.

\* cited by examiner

SELECTABLE MEMORY ACCESS TIME

FIELD

The present disclosure relates to memory access, in particular, to selectable memory access time.

BACKGROUND

Memory, e.g., computer memory, includes volatile memory and non-volatile memory (NVM). Volatile memory retains stored information while powered and loses the stored information when power is removed. NVM retains stored information after power is removed. Volatile memory includes, for example, dynamic random access memory (dynamic RAM) and static RAM. NVM includes, for example, read-only memory (ROM) and some types of RAM. NVM technology may include, but is not limited to, phase change memory (PCM), a three dimensional cross point memory, resistive memory, nanowire memory, ferroelectric transistor random access memory (FeTRAM), flash memory such as NAND or NOR, magnetoresistive random access memory (MRAM), memory that incorporates memristor technology, spin transfer torque (STT)-MRAM, etc.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
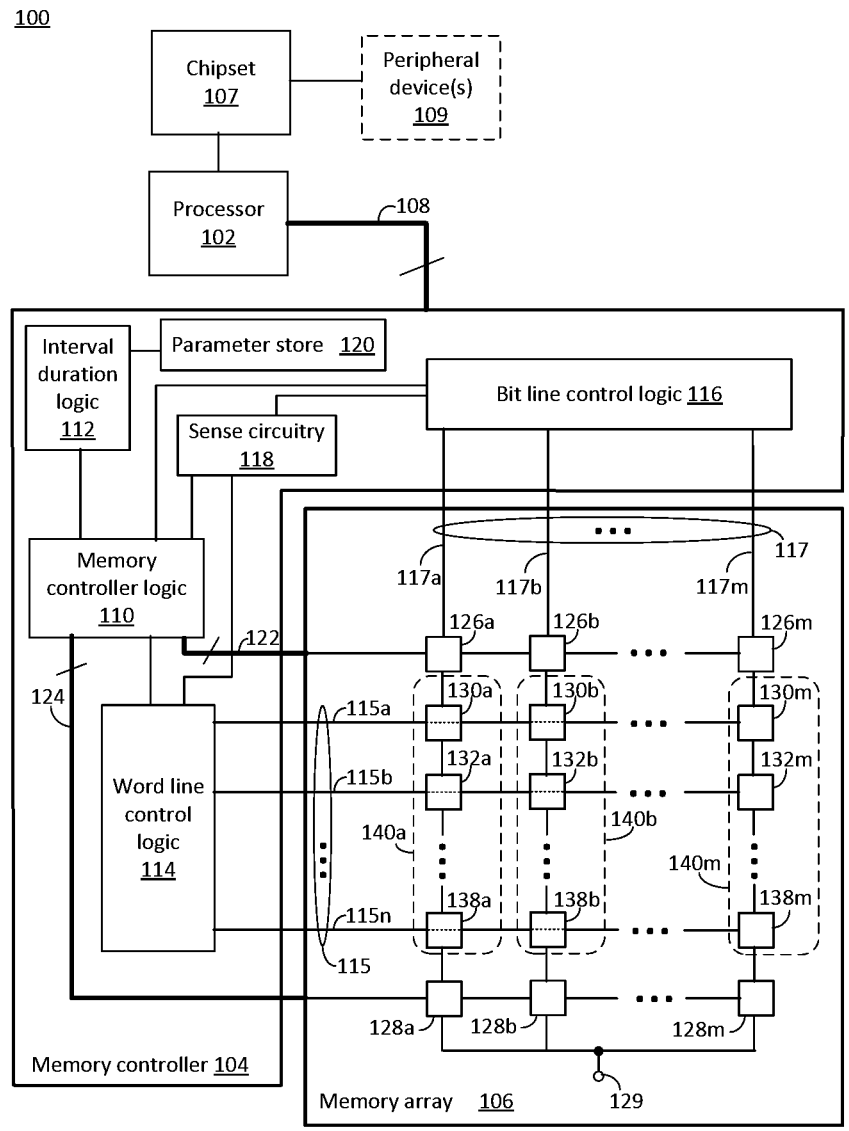
FIG. 1 illustrates a system block diagram consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

Memory may be categorized according to its physical structure as two-dimensional (2D), i.e., planar, or three-dimensional (3D). The plane of 2D memory corresponds to a plane of a substrate and/or a wafer. By convention, the plane of 2D memory is termed "horizontal" and the third dimension of 3D memory is termed "vertical". For example, 3D memory may include a plurality of vertically stacked, interconnected horizontal layers of 2D memory portions. In another example, 3D memory may include a plurality of groups of memory cells. In this example, the memory cells in each group may be stacked vertically. A tier may include a memory cell from each group of memory cells. As used herein, a tier includes a plurality of memory elements that are positioned generally equidistant from a substrate. Memory elements may include, but are not limited to, memory cells, selectors, word lines, bit lines, memory cell portions, etc. At least a subset of memory cells in each tier may be coupled to a respective word line, as described herein. In another example, 3D memory may include a plurality of interconnected layers of 3D memory. 3D memory may be further included in a system on chip (SoC). For example, an SoC may include a stack of layers that include a processor, a memory controller and a memory array.

Coupling structures such as interconnects, word lines and bit lines in a 2D memory architecture have a generally rectangular geometry. Thus, impedances associated with these coupling structures is generally uniform for each rectangular portion. In contrast, coupling structures in 3D memory architectures may define apertures (i.e., openings), through which, structures associated with memory cell portions may pass. Vertical structures may have a generally tapered shape with a vertically-oriented long axis and a horizontal dimension that varies with vertical position. In a 3D memory architecture, vertical memory cell structures may pass through apertures defined in generally horizontal word lines and/or bit lines. A size of such apertures is configured to accommodate the vertical memory cell structure, and, thus, size may vary by vertical position. A resistance associated with a word line and/or a bit line increases as the size of the aperture increases. Thus, resistance associated with coupling structures may vary by tier in the 3D memory array.

Memory cell access times are configured to allow a target node (e.g., control gate of a memory cell) to transition from an initial state (e.g., a deselect bias voltage) to a target state (e.g., a select bias voltage), dwell at the target state for a time period and then transition back to the initial state. Thus, a memory cell access time interval may include a precharge time interval, a sense time interval and a discharge time interval. A memory cell may be read and/or written to (i.e., programmed) while the target node is dwelling at the target state. A duration of each transition is related to impedances of circuitry that couples a memory controller to the target node and of the target node. For example, the circuitry that couples the memory controller to the target node may include an interconnect, a word line and/or a bit line (i.e., coupling structure(s)). The duration of each transition may then be related to an RC (resistance-capacitance) time constant of the coupling structure(s) and the target node. Thus, a time duration of a memory access may be related to (e.g., may be proportional) to the RC time constant. The resistance of the coupling structures may vary according to location, e.g., tier, in a 3D memory cell array, at least in part due to variation in geometry. The resistance of the coupling structure may further vary with operating temperature. The resistance of the coupling structures may further vary across wafer(s). In order to ensure that the memory access time duration is sufficient for a target node to reach the target state, dwell at the target state and transition back to the initial state for a memory access operation, memory cell access time may be determined based, at least in part, on a worst case time constant. Such a memory access time duration may then result in a relatively higher average memory access time and a relatively smaller throughput for a memory array.

Generally, this disclosure describes a system and method configured to select a memory access time interval based, at least in part, on a memory address associated with the memory access and/or to adjust the memory access time interval, based at least in part, on a current operating temperature. The geometry and, therefore, RC time constant of the coupling structures between a memory controller and a memory cell (e.g., resistance) and a memory cell (e.g., capacitance) is related to the memory address. In an embodiment, a duration of the memory access time interval may be predetermined. In another embodiment, the duration of the memory access time interval may be determined during manufacturing, e.g., during wafer and/or LOT (i.e., set of wafers that have been fabricated together) testing. The memory access time interval may then be associated with one or more memory addresses. In some embodiments, a temperature adjustment parameter may be determined. The temperature adjustment parameter is related to a change in resistance with temperature of a coupling structure associated with the memory address. The temperature adjustment parameter may then be associated with the one or more memory addresses.

In operation, the memory access time duration may be selected based, at least in part, on the memory address. The memory access time duration may then be adjusted based, at least in part, on current operating temperature. In some embodiments, the memory access time duration may be adjusted based, at least in part, on the temperature adjustment parameter. The temperature adjustment parameter is related to the current operating temperature. For example, a first memory access time duration of a first memory cell with a relatively smaller associated time constant may be relatively shorter than a second memory cell access time duration of a second memory cell with a relatively larger associated time constant. Thus, an average memory access time for a memory array may be reduced and memory array throughput may be increased relative to a memory access time that corresponds to a worst-case time constant. Memory array operational reliability may be further enhanced by accounting for operating temperature.

FIG. 1 illustrates a system block diagram 100 consistent with several embodiments of the present disclosure. System 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone; a personal digital assistant (PDA); etc.

System 100 includes a processor 102, a memory controller 104, a memory array 106 and a chipset 107. In some embodiments, system 100 may include one or more peripheral device(s) 109 coupled to system 100 by chipset 107. Peripheral device(s) 109 may include, for example, user interface device(s) including a display, a touch-screen display, printer, keypad, keyboard, etc., communication logic, wired and/or wireless, storage device(s) including hard disk drives, solid-state drives, removable storage media, etc.

The processor 102 is coupled to the memory controller 104 by bus 108. Processor 102 may provide read and/or write requests that include memory address(es) and/or associated data to memory controller 104 and may receive read data from memory controller 104. For example, processor 102 may receive one or more memory access request(s) from one or more of the peripheral devices 109 and may provide corresponding read and/or write requests to memory controller 104. Memory controller 104 is configured to perform memory access operations, e.g., reading and/or writing one or more target memory cell(s) and to determine and/or select one or more time interval duration(s) associated with accessing the target memory cell(s). It should be noted that system 100 is simplified for ease of illustration and description.

Memory array 106 includes a plurality of word lines (WLs) 115a, 115b, . . . , 115n (collectively 115), a plurality of bit lines (BLs) 117a, 117b, . . . , 117m (collectively 117), one or more selector line(s) 122, 124 and a plurality of memory cells 130a, 130b, . . . , 130m, 132a, 132b, . . . , 132m, . . . , 138a, 138b, . . . , 138m. Memory array 106 may be coupled to memory controller 104 by one or more of the WL(s) 115a, 115b, . . . , 115n and/or one or more of the BL(s) 117a, 117b, . . . , 117m. Memory array 106 may include a plurality of selectors 126a, 126b, . . . , 126m and 128a, 128b, . . . , 128m. The selector lines 122, 124 may each include a plurality of individual lines with each individual line configured to control a respective selector 126a, 126b, . . . , 126m and 128a, 128b, . . . , 128m. Selectors 126a, 126b, . . . , 126m are configured to controllably couple one or more memory cell(s) to an associated BL and selectors 128a, 128b, . . . , 128m are configured to controllably couple the one or more memory cell(s) to a common 129, e.g., a substrate. Selectors 126a, 126b, . . . , 126m and 128a, 128b, . . . , 128m may include ovonic threshold switches, diodes, bipolar junction transistors, field-effect transistors, etc. Thus, each memory cell is coupled to a WL and may be coupled to a BL.

In some embodiments, a memory cell may be coupled to a BL via one or more other memory cells. For example, memory array 106 may include 3D NAND flash memory. In NAND flash memory, a plurality of memory cells are coupled in series (i.e., a string) with a first memory cell in the series controllably coupled to a BL and a last memory cell in the series controllably coupled to a common, e.g., a substrate and/or ground. For example, in memory array 106 a first string 140a includes memory cells 130a, 132a, . . . , 138a, a second string 140b includes memory cells 130b, 132b, . . . , 138b and an $m^{th}$ string 140m includes memory cells 130m, 132m, . . . , 138m. Each string, e.g., string 140a, may be controllably coupled to a respective BL, e.g., BL 117a, by a respective first selector, e.g., selector 126a, and to the common 129 by a respective second selector, e.g., selector 128a.

Continuing with this example, a target memory cell, e.g., memory cell 130a, may be selected by applying a WL select voltage to an associated WL 115a coupled to the target memory cell, applying a BL select voltage to an associated BL 117a, coupling the associated BL 117a to the string 140a via selector 126a and the string 140a to the common 129 via selector 128a. The other memory cells 132a, . . . , 138a in the string 140a may be configured to pass BL current by application of an appropriate supply voltage (e.g., Vpass) to each other memory cell 132a, . . . , 138a via a respective WL 115b, . . . , 115n.

Each memory cell 130a, 130b, . . . , 130m, 132a, 132b, . . . , 132m, . . . , 138a, 138b, . . . , 138m is configured to store information. In an embodiment, each memory cell may be configured to store one bit of binary data. In this embodiment, the memory cell may be understood as a single level cell (SLC). In another embodiment, each memory cell may be configured to store a plurality of bits of binary data. In this embodiment, the memory cell may be understood as a multiple level cell (MLC). One or more memory cells 130a, 130b, . . . , 130m, 132a, 132b, . . . , 132m, . . . , 138a, 138b, . . . , 138m may be written to (i.e., programmed) and/or read from. The memory cells 130a, 130b, . . . , 130m, 132a, 132b, . . . , 132m, . . . , 138a, 138b, . . . , 138m may be included in one or more layers (i.e., tiers) of memory cells. Each tier may further include one or more WLs and one or more BLs. Memory array 106 may have an associated density, i.e., number of memory cells per unit area or unit volume.

Memory array 106 may include, but is not limited to, phase change memory (PCM), a three dimensional cross point memory, resistive memory, nanowire memory, ferroelectric transistor random access memory (FeTRAM), flash memory such as NAND or NOR, magnetoresistive random access memory (MRAM), memory that incorporates memristor technology, spin transfer torque (STT)-MRAM, etc.

In an embodiment, memory array 106 may correspond to 3D memory. For example, 3D memory may include, but is not limited to, 3D NAND flash memory (e.g., vertical-stacked-array transistor memory, multi-layered vertical gate NAND flash memory, vertical cell terabit cell array transistor NAND flash memory, pipe-shaped BiCS (Bit Cost Scalable) NAND flash memory), one-time-programmable diode/antifuse memory, vertical resistive memory (VRRAM), 3D vertical chain-cell-type phase change memory, etc. 3D NAND flash memory cells typically include MOSFET (metal oxide semiconductor field effect transistor) transistors. Programming the NAND flash memory cell includes setting a threshold voltage of the associated MOSFET and reading the memory cell includes detecting the threshold voltage, as described herein.

Diode/antifuse memory cells include transistorless two-terminal memory cells that include an antifuse and a diode. Programming the diode/antifuse memory cell includes rupturing the antifuse and reading the memory cell includes whether the antifuse is intact (i.e., open) or ruptured (i.e., shorted). VRRAM is a resistive RAM (ReRAM) where the ReRAM cells are integrated in a multi-layer vertical NAND-like configuration. ReRAM memory cells may be considered a specific type of memristor. Resistance of a memristor depends on its past history. In other words, resistance of a memristor is related to the flux of electric charge through the memristor. Programming ReRAM memory cells includes applying one or more voltages to a memory cell configured to cause the memory cell to switch between one or more resistances. ReRAM memory cells may have a plurality of discrete resistance states or may have a continuously variable resistance.

In 3D vertical chain-cell-type phase change memory, each memory cell may include a poly-silicon transistor and a phase-change layer coupled in parallel. The memory cells may be coupled serially in the vertical direction. In programming (i.e. set/reset) operations, an off-voltage is applied to a gate of a selected cell and a positive on-voltage is applied to the unselected cells. When a set/reset pulse voltage is applied to the drain, the current flows through the phase-change material of the selected cell, and the temperature is increased by Joule heating, causing the set/reset operation. In read operations, a read voltage (Vread) may be applied to the drain and the resistance of the phase-change film at the selected cell determined.

3D NAND flash memory may include a plurality of memory cell architectures. Memory cell architectures include, but are not limited to, vertical channel, vertical gate (i.e., horizontal channel), floating gate and/or charge trap 3D NAND flash memory. Vertical channel 3D NAND flash memory includes a stacked vertical string of MOSFET memory cells with vertical channels between respective drain and source nodes. The interconnected channels are configured as a single vertical channel that has a generally tapered cylindrical shape and provides the coupling between memory cells in the string. Each memory cell includes a gate structure ("gate-all-around") that surrounds the vertical channel. Stacked horizontal WLs may be coupled to the gate structures. The vertical channel and respective gate structures extend through apertures defined by the WLs. The resistance of each WL is related to the diameter of the aperture which is related to the diameter of the vertical channel and varies according to tier, as described herein. Vertical gate 3D NAND flash memory includes MOSFET memory cells configured as stacked horizontal channels with vertical gates. For example, vertical gate 3D NAND flash memory may include a plurality of 2D layers of memory cells that are interconnected to form NAND strings.

For example, for MOSFET memory cells, a drain of the first memory cell 130a may be coupled to the first selector 126a, a source of the first memory cell 130a may be coupled to a drain of the second memory cell 132a, a source of the second memory cell 132a may be coupled to drain of a third memory cell and so on until a source of the last memory cell 138a may be coupled to selector 128a. A control gate of the first memory cell 130a may be coupled to the first WL 115a. Each control gate of the other memory cells 132a, . . . , 138a may be coupled to a respective WL 115b, . . . , 115n. In a read operation for example, the WL select voltage applied to the first WL 115a may correspond to Vread. A voltage (Vpass) configured to cause the other memory cells 132a, . . . , 138a to conduct (i.e., to turn on) may be applied to the other WLs 115b, . . . , 115n. The read voltage, Vread, is configured be greater than a first threshold voltage associated with a first state of the target memory cell and less than a second threshold voltage associated with a second state of the target memory cell. The first threshold voltage is less than the second threshold voltage. Vpass is configured to be greater than the second threshold voltage. Thus, if current flows in the string in response to Vread, the first state may be detected and if current does not flow, the second state may be detected. For an SLC memory cell, the first state typically corresponds to a logic one and the second state typically corresponds to a logic zero.

The voltages at the control gates of the memory cells 130a, 130b, . . . , 130m, 132a, 132b, . . . , 132m, . . . , 138a, 138b, . . . , 138m do not change instantaneously. Thus, when a voltage applied to a respective WL changes, the voltage at an associated control gate transitions over a finite time period from an initial voltage to a target voltage related to the newly applied voltage. A duration of the finite time period is related to the RC time constant associated with the coupling structures and the memory cell, as described herein. A specific coupling structure corresponds to an associated memory cell and, therefore an associated memory address. Thus, the associated memory addresses may identify the coupling structure as well as the associated memory cell. Thus, a duration of a memory cell access time period may be related to the address of the associated memory cell and then selected based, at least in part, on the address of the associated memory cell.

Memory controller 104 includes memory controller logic 110, WL control logic 114, BL control logic 116, sense circuitry 118, interval duration logic 112 and a parameter store 120. Memory controller logic 110 is configured to perform operations associated with memory controller 104. For example, memory controller logic 110 may manage communications with processor 102. Memory controller logic 110 may be configured to identify one or more target WLs and/or BLs associated with each received memory address. Memory controller logic 110 may be configured to manage operations of WL control logic 114 and BL control logic 116 based, at least in part, on the target WL and/or target BL identifiers (i.e., addresses).

WL control logic 114 is configured to receive target WL address(es) from memory controller logic 110 and to select one or more WLs for reading and/or writing operations. For example, WL control logic 114 may be configured to select a target WL by coupling a WL select bias voltage to the target WL. WL control logic 114 may be configured to deselect a WL by decoupling the target WL from the WL select bias voltage and/or by coupling a WL deselect bias voltage to the WL. For example, the WL select bias voltage may correspond to Vread and the WL deselect bias voltage may correspond to Vpass. WL control logic 114 may be coupled to the plurality of WLs 115. BL control logic 116 is configured to receive target BL address(es) from memory controller logic 110 and to select one or more BLs for memory access operations, e.g., reading and/or writing. BL control logic 116 may be configured to select a target BL by coupling a BL select bias voltage to the target BL. BL control logic 116 may be configured to deselect a BL by decoupling the target BL from the BL select bias voltage and/or by coupling a BL deselect bias voltage to the BL. Memory controller logic 110 is configured to manage select, read and write operations of WL control logic 114 and BL control logic 116 and to receive sense data from sense circuitry 118. For example, memory controller logic 110 may select one or more of strings 140a, . . . , 140m by coupling one or more BL(s) 117a, 117b, . . . , 117m to respective string(s) 140a, . . . , 140m using one or more of selector(s) 126a, 126b, . . . , 126m and coupling the strings 140a, . . . , 140m to the common 129 using one or more of selector(s) 128a, 128b, . . . , 128m, respectively.

Interval duration logic 112 is configured to select a memory access time interval based, at least in part, on a memory address associated with a memory access. Parameter store 120 is configured to store information related to memory access time interval(s) and associated memory address(es). The information may include one or more memory address identifier(s) and one or more parameters related to memory access time intervals. In some embodiments, the information may include one or more parameter(s) related to variation of memory access time interval parameters with temperature, i.e., temperature parameters. For example, the memory address identifier(s) may correspond to index(es) in a look-up table that includes the parameters related to memory access time intervals. Each memory address identifier may correspond to one or more memory addresses. For example, the memory address identifier may include at least a portion of one or more associated memory address(es). One memory access time interval duration may be related to one memory address, to a range of contiguous memory addresses and/or to a plurality of memory addresses that may or may not be contiguous. For example, the plurality of memory addresses may correspond to memory cells that are located on a same tier in a memory array.

The parameters related to memory access time interval may include time interval duration(s) in units of time and/or count(s) of clock cycles of a system clock. The parameters may include a precharge time interval duration, a sense time interval duration, a programming time interval duration, a discharge time interval duration and/or a memory access time interval duration. For example, for a read operation, the memory access time interval may include the precharge time interval duration, the sense time interval duration and the discharge time interval duration. In another example, for a program (i.e., write) operation, the memory access time interval may include the precharge time interval duration, the sense time interval duration, the programming time interval duration and the discharge time interval duration. The time interval durations may be related to memory array architecture, memory cell type and/or location of the memory cell within the memory array. Value(s) of one or more of the parameter(s) may be based, at least in part, on coupling structure (e.g., WL and/or BL) resistance value(s).

The temperature parameters include temperature adjustment parameters configured to relate operating temperature to memory access time interval. Temperature parameters may include current operating temperature. Coupling structure resistance may vary with temperature. Memory arrays, e.g., memory array 106, are typically configured to operate over a specified temperature range, e.g., −40° C. to +85° C. Coupling structure resistance may vary over this temperature range. For example, a resistance of a coupling structure at +85° C. may be, e.g., 20% higher than the resistance of the coupling structure at +25° C. Such increase in resistance may similarly increase memory access time. Temperature sensitivity of coupling structure resistance may vary based, at least in part, on location within a memory array. Thus, temperature sensitivity may be related to memory address identifier(s).

Temperature parameters may include a current operating temperature ($T_{cur}$) and/or one or more temperature adjustment parameter(s). Temperature adjustment parameter(s) may include, but are not limited to, a temperature-dependent adjustment factor (AF(T)), a rate of change of coupling structure resistance with temperature ($\Delta R/\Delta T$), a temperature range related to $\Delta T$ and associated with the rate of change of coupling structure resistance, a scale factor (SF) associated with the rate of change of coupling structure resistance and/or a nominal (i.e., baseline) operating temperature ($T_{nom}$).

The temperature-dependent adjustment factor AF may be associated with one or more temperatures and/or a range of temperatures. The adjustment factor AF is configured to relate a selected (e.g., nominal) memory access time interval parameter ($P_{nom}$) to that parameter adjusted ($P_{adj}$) for the current operating temperature $T_{cur}$. For example, a current operating temperature $T_{cur}$ may be determined, as described herein, and an associated AF(T=$T_{cur}$) may be selected, based at least in, part on a memory address identifier associated with $P_{nom}$ and based, at least in part, on the current operating temperature $T_{cur}$. For example, AF may be selected from a look-up table included in parameter store 120. $P_{adj}$ may then be determined for the current operating temperature $T_{cur}$ as $P_{adj}=P_{nom}(1+AF(T=T_{cur}))$.

In another example, $P_{adj}$ may be determined using $\Delta R/\Delta T$, $T_{cur}$ and $T_{nom}$, $P_{adj}$. A current operating temperature $T_{cur}$ may be determined, by, e.g., interval duration logic 112, as described herein. $\Delta R/\Delta T$ and $T_{nom}$ may then be selected from, e.g., parameter store 120, based, at least in part on a memory address identifier associated with $P_{nom}$. $P_{adj}$ may then be determined as $P_{adj}=1+(\Delta R/\Delta T)*(T_{cur}-T_{nom})$. In some embodiments, $\Delta R/\Delta T$ may be modified by scale factor SF. In these embodiments, $P_{adj}$ may be determined as $P_{adj}=1+SF*(\Delta R/\Delta T)*(T_{cur}-T_{nom})$. Of course, these relationships may be simplified, for example when $T_{nom}$ is fixed and known, e.g., 25° C. Thus, a selected memory access time interval may be adjusted based, at least in part, on a current operating temperature. The selected memory access time interval may be adjusted based, at least in part, on one or more temperature adjustment parameters. Thus, a selected memory access time interval parameter may be adjusted to reflect temperature-dependent variation in coupling structure resistance. One or more of the temperature adjustment parameter(s) may be associated with one or more memory address identifier(s) and stored in parameter store 120.

Interval duration logic 112 may receive memory address identifier(s) from memory controller logic 110 and may select one or more memory access time interval parameter(s) from parameter store 120 based, at least in part, on the received memory address identifier(s). Interval duration logic 112 may then provide the selected memory access time interval parameter(s) to the memory controller logic 110. The selected memory access time interval parameter(s) are related to time constant(s) associated with coupling structures (e.g., WL and/or BL), as described herein. Memory controller logic 110 may then utilize the selected and/or adjusted memory access time interval parameter(s) for memory access operation(s) associated with the received memory address identifiers.

In some embodiments, during operation, interval duration logic 112 may be configured to select and/or determine a nominal memory access time interval, as described herein. In these embodiments, interval duration logic 112 may be further configured to determine a current operating temperature and to adjust the nominal memory access time interval based, at least in part, on the determined current operating temperature. For example, interval duration logic 112 and/or memory controller logic 110 may be configured to receive temperature information from, e.g., a baseband controller, temperature sensor, etc. Interval duration logic 112 may then be configured to adjust the nominal memory access time interval duration parameter based, at least in part, on the received temperature information, e.g., current operating temperature. For example, interval duration logic 112 may be configured to retrieve one or more temperature adjustment parameters associated with the memory address identifiers from parameter store 120. Interval duration logic 112 may then adjust the selected memory access time interval duration parameter using the retrieved adjustment parameters, as described herein.

Thus, during operation, interval duration logic 112 is configured to select, determine and/or adjust a memory access time interval based, at least in part, on a memory address associated with a memory access, as described herein. Internal duration logic 112 may be further configured to adjust the memory access time interval based, at least in part, on a current operating temperature. Interval duration logic 112 may be further configured to determine the memory access time interval parameter(s) and/or temperature parameters(s), associate the parameter(s) with one or more memory address identifier(s) and/or to store the information in parameter store 120.

In an embodiment, the memory access time interval parameter(s) may be predetermined. For example, the memory access time interval parameter(s) may be predetermined when a WL resistance and/or BL resistance is relatively consistent across a wafer and/or LOT. The memory access time interval parameter(s) may be predetermined, for example, based, at least in part on coupling structure geometry. It should be noted that a plurality of memory arrays, e.g., memory array 106, may be formed on one wafer. The WL resistance and/or BL resistance of coupling structures associated with a memory cell at a respective memory address in each memory array may be similar across the wafer and/or LOT. For example, the predetermined memory access time interval parameter(s) and associated memory address identifier(s) may be provided to system 100 by a user via peripheral device(s) 109. The received parameter(s) and identifier(s) may be provided to interval duration logic 112 by, e.g., memory controller logic 110. The interval duration logic 112 may then be configured to associate the received parameter(s) with the received memory address identifier(s) and/or to store the information in parameter store 120.

In another embodiment, the memory access time interval parameter(s) may be determined during manufacturing. The memory access time interval parameter(s) may be determined during manufacturing when resistance(s) of coupling structures associated with a memory cell at a respective memory address of each memory array vary across a wafer and/or LOT. The resistance(s) of the coupling structures are related to coupling structure geometry, as described herein. The memory access time interval parameter(s) may be determined during testing of a wafer that includes memory array 106. In this embodiment, the memory access time interval parameter(s) may be determined utilizing one or more trim-by-die operation(s). Trim-by-die is configured to allow setting the memory access time interval parameter(s) for each memory cell at a specific memory address by die and/or across a wafer.

For example, resistance(s) of coupling structures may be measured and the memory access time interval parameter(s) may be determined based, at least in part, on the measured resistance(s) of the coupling structures. In another example, the memory access time interval parameter(s) may be determined iteratively. In this example, the memory access time interval parameter(s) may initially be set to relatively small values. Memory access time interval parameter(s) set to relatively small values may result in a relatively high number of read failures since WLs may not reach target voltages in the memory access time interval. A number of trials of memory access operations (e.g., read operations) of target memory cell(s) may be performed and a number of memory read failures may be counted. If the number of read failures is greater than a threshold number of read failures, the memory access time interval parameter(s) may be increased. The number of trials of read operations may be repeated with the increased memory access time interval parameters and the number of memory read failures may again be counted. The process may be repeated until the number of memory read failures is at or below the threshold. The current memory access time interval parameter(s) may then be captured, associated with memory address identifier(s) that correspond to the target memory cell(s) and stored in parameter store 120.

In an embodiment, the temperature parameter(s) may be predetermined. The temperature parameter(s) may be predetermined similar to the predetermination associated with the memory access time interval parameters, as described herein. In another embodiment, one or more of the temperature parameter(s) may be determined during testing of a wafer that includes memory array 106. The wafer may be heated to one or more temperatures in the operating range and resistances of one or more of the coupling structures determined. One or more of the temperature parameter(s) may then be captured and/or determined. The temperature parameters may then be associated with memory address identifier(s) that correspond to the target memory cell(s) and stored in parameter store 120.

Thus, a memory access time interval duration parameter may be selected and/or adjusted based, at least in part, on an memory address associated with a memory access. The memory access time interval duration parameter is related to resistance(s) of coupling structure(s) associated with the memory address identifier related to the memory address.

The memory access time interval duration parameter may be adjusted based, at least in part, on current operating temperature. An average memory access time for a memory array may then be reduced and an associated throughput for the memory may be increased.

Figure 2:
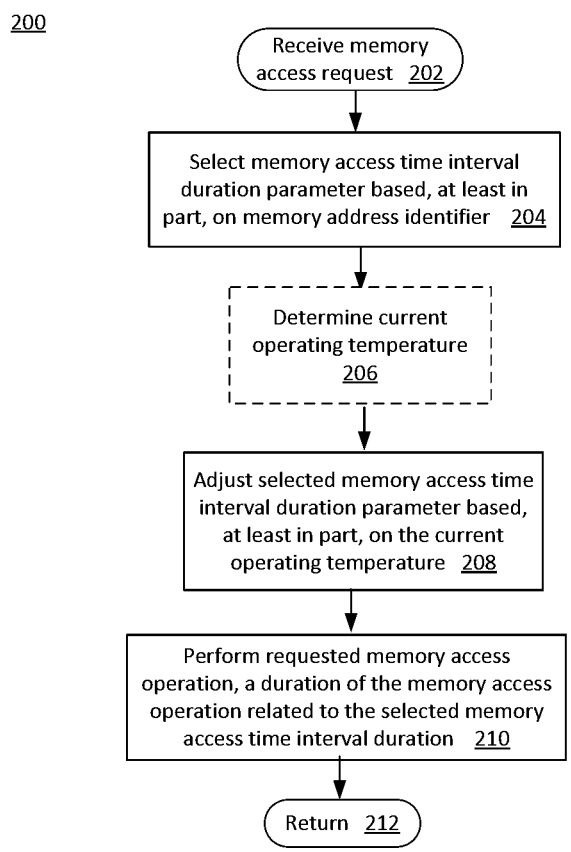
FIG. 2 illustrates a flowchart of operations for selecting and/or adjusting a memory access time interval based, at least in part, on a memory address associated with the memory access, consistent with various embodiments of the present disclosure.

FIG. 2 illustrates a flowchart 200 of operations for selecting and/or adjusting a memory access time interval duration based, at least in part, on a memory address identifier associated with the memory access, consistent with various embodiments of the present disclosure. The operations may be performed, for example, by a memory controller, e.g., memory controller 104, including memory controller logic 110, interval duration logic 112 and/or a parameter store 120. Flowchart 200 depicts exemplary operations configured to select and/or adjust the duration of the memory access time interval to accommodate variation in coupling structure resistance related to memory array architecture and/or operating temperature, as described herein. In particular, flowchart 200 depicts exemplary operations configured to select and/or adjust memory access time interval duration(s) to accommodate variation in an RC time constant associated with coupling structure(s), as described herein.

Operations of flowchart 200 may start at operation 202. Operation 202 includes receiving a memory access request. For example, the memory access request may be received by a memory controller from a processor. The memory access request may include a memory cell read request and/or a memory cell write request. The memory access request may further include one or more memory address(es) associated with the memory access request. Operation 204 includes selecting a memory access time interval duration parameter based, at least in part, on a memory address identifier. The memory access identifier may correspond and/or be related to the received memory address(es). For example, memory address identifier(s) may be associated with memory access time interval duration parameter(s) and/or temperature parameter(s) and stored in a parameter store. In some embodiments, a current operating temperature may be determined at operation 206. In some embodiments, operation 208 may include adjusting the selected memory access time interval duration parameter based, at least in part, on the current operating temperature. The requested memory access operation may be performed at operation 210. A duration of the memory access operation is related to the selected memory access time interval duration parameter. Program flow may return at operation 212.

Figure 3:
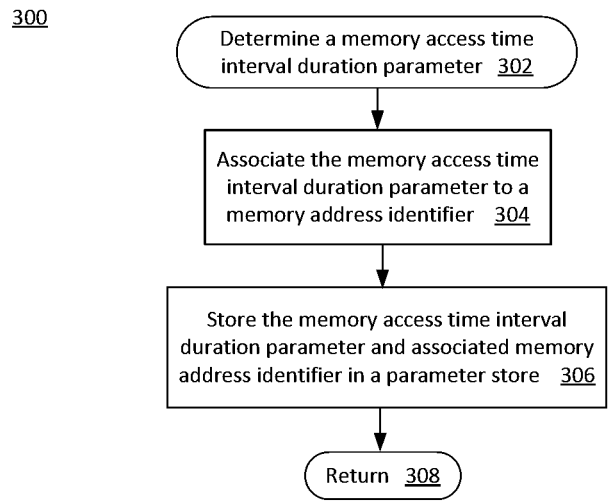
FIG. 3 illustrates a flowchart of operations for determining a memory access time interval related to a memory address associated with the memory access, consistent with various embodiments of the present disclosure.

FIG. 3 illustrates a flowchart 300 of operations for determining a memory access time interval related to a memory address associated with the memory access, consistent with various embodiments of the present disclosure. The operations may be performed, for example, by a memory controller, e.g., memory controller 104, including memory controller logic 110 and/or interval duration logic 112. Flowchart 300 depicts exemplary operations configured to determine a memory access time interval related to a memory address associated with the memory access. In particular, flowchart 300 depicts exemplary operations configured to determine a memory access time interval related to a memory address associated with the memory access to accommodate variation in an RC time constant associated with coupling structures, as described herein.

Operations of flowchart 300 may start at operation 302. Operation 302 includes determining a memory access time interval duration parameter. The memory access time interval duration parameter is related to resistance(s) of coupling structure(s), as described herein. For example, the memory access time interval duration parameter may be determined based, at least in part, on measured resistance(s) of coupling structure(s). In another example, the memory access time interval duration parameter may be determined iteratively, as described herein. The memory access time interval duration parameter may be determined for one or more memory cell(s). The memory access time interval duration parameter may be associated with a memory address identifier at operation 304. The memory access time interval duration parameter and associated memory address identifier may be stored in a parameter store at operation 306. Program flow may return at operation 308.

Thus, a memory access time interval duration may be associated with a memory address. The memory access time interval duration is configured to accommodate variation in coupling structure resistance and variation in RC time constant(s) for a plurality of memory cells in a memory array.

Figure 4:
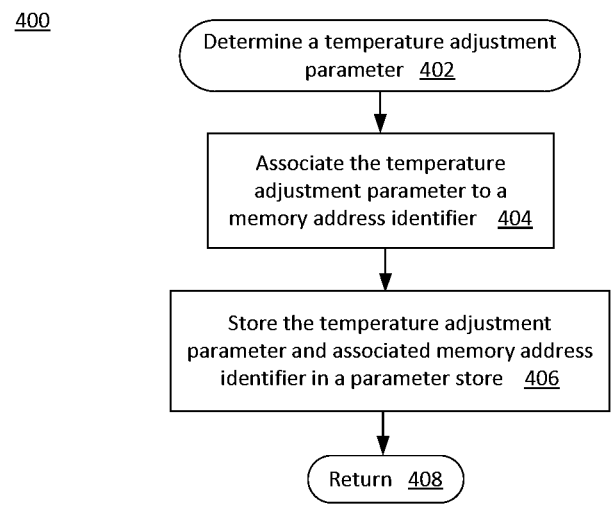
FIG. 4 illustrates a flowchart of operations for determining a temperature adjustment parameter related to a memory address associated with the memory access, consistent with various embodiments of the present disclosure.

FIG. 4 illustrates a flowchart 400 of operations for determining a temperature adjustment parameter related to a memory address associated with the memory access, consistent with various embodiments of the present disclosure. The operations may be performed, for example, by a memory controller, e.g., memory controller 104, including memory controller logic 110 and/or interval duration logic 112. Flowchart 400 depicts exemplary operations configured to determine a temperature adjustment parameter related to a memory address associated with the memory access. In particular, flowchart 400 depicts exemplary operations configured to determine a temperature adjustment parameter related to a memory address associated with the memory access to accommodate variation in an RC time constant with temperature, as described herein.

Operations of flowchart 400 may start at operation 402. Operation 402 includes determining a temperature adjustment parameter. The temperature adjustment parameter is related to operating temperature, as described herein. For example, the temperature adjustment parameter may be determined based, at least in part, on measured resistance(s) of coupling structure(s) at one or more operating temperature(s). The temperature adjustment parameter may be determined for one or more memory cell(s). The temperature adjustment parameter may be associated with a memory address identifier at operation 404. The temperature adjustment parameter and associated memory address identifier may be stored in a parameter store at operation 406. Program flow may return at operation 408.

Thus, a temperature adjustment parameter may be associated with a memory address. The temperature adjustment parameter is configured to accommodate variation in coupling structure resistance and variation in RC time constant(s) with temperature for a plurality of memory cells in a memory array.

While FIGS. 2 through 4 illustrate various operations according one embodiment, it is to be understood that not all of the operations depicted in FIGS. 2, 3 and/or 4 are necessary for other embodiments. Indeed, it is fully contemplated herein that in other embodiments of the present disclosure, the operations depicted in FIGS. 2, 3 and/or 4 and/or other operations described herein may be combined in a manner not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations.

Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

Thus, a system and method configured to select and/or adjust a memory access time interval based, at least in part, on a memory address associated with the memory access has been described. The memory access time is related to the RC time constant of the coupling structures between a memory controller and a memory cell and the memory cell capacitance. The memory access time may be further related to operating temperature. The memory access time interval may then be associated with one or more memory addresses. In operation, the memory access time duration may be selected based, at least in part, on the memory address. The selected memory access time duration may then be adjusted based, at least in part, on current operating temperature. Thus, average memory cell access time for at least a portion of the memory array may be improved relative to a memory access time duration based on a worst-case RC time constant.

EXAMPLES

Examples of the present disclosure include subject material such as a method, means for performing acts of the method, a device, or of an apparatus or system related to setting and/or selecting a memory access time interval based, at least in part, on a memory address associated with the memory access, as discussed below.

Example 1

According to this example there is provided an apparatus including a memory controller configured to select a memory access time interval duration parameter based, at least in part, on a memory address identifier, in response to receiving a memory access request; to adjust the selected memory access time interval duration parameter based, at least in part, on a current operating temperature; and perform a requested memory access operation on a memory array, a duration of the memory access operation related to the adjusted memory access time interval duration parameter.

Example 2

This example includes the elements of example 1, wherein the memory controller is further configured to determine the memory access time interval duration parameter; associate the memory access time interval duration parameter with the memory address identifier; and store the memory access time interval duration parameter and the associated memory address identifier in a parameter store.

Example 3

This example includes the elements of example 1 or 2, wherein the memory access operation comprises at least one of a memory cell read operation and a memory cell write operation.

Example 4

This example includes the elements of example 1 or 2, wherein a memory access time interval comprises a pre-charge time interval configured to transition a target node from an initial state to a target state, a duration of the precharge time interval related to a coupling structure of the memory array.

Example 5

This example includes the elements of example 2, wherein the memory access time interval parameter is predetermined based, at least in part, on a coupling structure geometry of the memory array.

Example 6

This example includes the elements of example 2, wherein the memory access time interval parameter is determined iteratively, based, at least in part, on a number of trials of memory access operations.

Example 7

This example includes the elements of example 2, wherein the memory controller is configured to associate the memory access time interval parameter to a plurality of memory address identifiers.

Example 8

This example includes the elements of example 7, wherein the plurality of memory address identifiers correspond to contiguous memory locations.

Example 9

This example includes the elements of example 7, wherein the plurality of memory address identifiers correspond to memory locations included in one tier of the memory array.

Example 10

This example includes the elements of example 2, wherein the memory access time interval duration parameter is determined utilizing one or more trim-by-die operation(s).

Example 11

This example includes the elements of example 2, wherein the memory controller is further configured to determine a temperature adjustment parameter, associate the temperature adjustment parameter with the memory address identifier and store the temperature adjustment parameter to the parameter store.

Example 12

This example includes the elements of example 1, wherein the memory controller is further configured to determine the current operating temperature and to select a temperature adjustment parameter based, at least in part, on the memory address identifier, the adjusted memory access time interval duration parameter related to the temperature adjustment parameter.

Example 13

This example includes the elements of example 11 or 12, wherein the temperature adjustment parameter is related to a change in resistance with temperature of a coupling structure associated with the memory address identifier.

Example 14

This example includes the elements of example 11 or 12, wherein the temperature adjustment parameter comprises one or more of a temperature-dependent adjustment factor (AF(T)), a rate of change of coupling structure resistance with temperature ($\Delta R/\Delta T$), a temperature range related to $\Delta T$ and associated with the rate of change of coupling structure resistance, a scale factor (SF) associated with the rate of change of coupling structure resistance and/or a baseline operating temperature ($T_{nom}$).

Example 15

According to this example there is provided a method including selecting, by a memory controller, a memory access time interval duration parameter based, at least in part, on a memory address identifier, in response to receiving a memory access request; adjusting, by the memory controller, the selected memory access time interval duration parameter based, at least in part, on a current operating temperature; and performing, by the memory controller, a requested memory access operation on a memory array, a duration of the memory access operation related to the adjusted memory access time interval duration parameter.

Example 16

This example includes the elements of example 15, and further includes determining, by the memory controller, the memory access time interval duration parameter; associating, by the memory controller, the memory access time interval duration parameter with the memory address identifier; and storing, by the memory controller, the memory access time interval duration parameter and the associated memory address identifier in a parameter store.

Example 17

This example includes the elements of example 15, wherein the memory access operation comprises at least one of a memory cell read operation and a memory cell write operation.

Example 18

This example includes the elements of example 15, wherein a memory access time interval comprises a precharge time interval configured to transition a target node from an initial state to a target state, a duration of the precharge time interval related to a coupling structure of the memory array.

Example 19

This example includes the elements of example 15, wherein the memory array comprises a three dimensional memory architecture.

Example 20

This example includes the elements of example 16, wherein the memory access time interval parameter is predetermined based, at least in part, on a coupling structure geometry of the memory array.

Example 21

This example includes the elements of example 16, wherein the memory access time interval parameter is determined iteratively, based, at least in part, on a number of trials of memory access operations.

Example 22

This example includes the elements of example 16, wherein the memory controller is configured to associate the memory access time interval parameter to a plurality of memory address identifiers.

Example 23

This example includes the elements of example 22, wherein the plurality of memory address identifiers correspond to contiguous memory locations.

Example 24

This example includes the elements of example 22, wherein the plurality of memory address identifiers correspond to memory locations included in one tier of the memory array.

Example 25

This example includes the elements of example 16, wherein the memory access time interval duration parameter is determined utilizing one or more trim-by-die operation(s).

Example 26

This example includes the elements of example 16 and further includes determining, by the memory controller, a temperature adjustment parameter; associating, by the memory controller, the temperature adjustment parameter with the memory address identifier; and storing, by the memory controller, the temperature adjustment parameter to the parameter store.

Example 27

This example includes the elements of example 15 and further includes determining, by the memory controller, the current operating temperature; and selecting, by the memory controller, a temperature adjustment parameter based, at least in part, on the memory address identifier, the adjusted memory access time interval duration parameter related to the temperature adjustment parameter.

Example 28

This example includes the elements of example 26, wherein the temperature adjustment parameter is related to a change in resistance with temperature of a coupling structure associated with the memory address identifier.

Example 29

This example includes the elements of example 26, wherein the temperature adjustment parameter comprises one or more of a temperature-dependent adjustment factor (AF(T)), a rate of change of coupling structure resistance with temperature ($\Delta R/\Delta T$), a temperature range related to $\Delta T$ and associated with the rate of change of coupling structure resistance, a scale factor (SF) associated with the rate of change of coupling structure resistance and/or a baseline operating temperature ($T_{nom}$).

Example 30

According to this example there is provided a system including a processor; a chipset configured to couple the processor to a peripheral device; a memory array comprising a plurality of memory cells; and a memory controller. The memory controller is configured to select a memory access time interval duration parameter based, at least in part, on a memory address identifier, in response to receiving a memory access request; to adjust the selected memory access time interval duration parameter based, at least in part, on a current operating temperature; and perform a requested memory access operation on the memory array, a duration of the memory access operation related to the adjusted memory access time interval duration parameter.

Example 31

This example includes the elements of example 30, wherein the memory controller is further configured to determine the memory access time interval duration parameter; associate the memory access time interval duration parameter with the memory address identifier; and store the memory access time interval duration parameter and the associated memory address identifier in a parameter store.

Example 32

This example includes the elements of example 30 or 31, wherein the memory access operation comprises at least one of a memory cell read operation and a memory cell write operation.

Example 33

This example includes the elements of example 30 or 31, wherein a memory access time interval comprises a precharge time interval configured to transition a target node from an initial state to a target state, a duration of the precharge time interval related to a coupling structure of the memory array.

Example 34

This example includes the elements of example 30 or 31, wherein the memory array comprises a three dimensional (3D) memory architecture.

Example 35

This example includes the elements of example 34, wherein the memory array comprises 3D NAND flash memory.

Example 36

This example includes the elements of example 30 or 31, wherein the memory array comprises at least one of phase change memory (PCM), a three dimensional cross point memory, resistive memory, nanowire memory, ferro-electric transistor random access memory (FeTRAM), flash memory such as NAND or NOR, magnetoresistive random access memory (MRAM), memory that incorporates memristor technology and spin transfer torque (STT)-MRAM.

Example 37

This example includes the elements of example 34, wherein the memory array comprises at least one of vertical-stacked-array transistor memory, multi-layered vertical gate NAND flash memory, vertical cell terabit cell array transistor NAND flash memory, pipe-shaped BiCS (Bit Cost Scalable) NAND flash memory, one-time-programmable diode/antifuse memory, vertical resistive memory (VRRAM) and 3D vertical chain-cell-type phase change memory.

Example 38

This example includes the elements of example 31, wherein the memory access time interval parameter is predetermined based, at least in part, on a coupling structure geometry of the memory array.

Example 39

This example includes the elements of example 31, wherein the memory access time interval parameter is determined iteratively, based, at least in part, on a number of trials of memory access operations.

Example 40

This example includes the elements of example 30 or 31, wherein the memory controller is configured to associate the memory access time interval parameter to a plurality of memory address identifiers.

Example 41

This example includes the elements of example 40, wherein the plurality of memory address identifiers correspond to contiguous memory locations.

Example 42

This example includes the elements of example 40, wherein the plurality of memory address identifiers correspond to memory locations included in one tier of the memory array.

Example 43

This example includes the elements of example 30 or 31, wherein the memory cells are single level cells.

Example 44

This example includes the elements of example 30 or 31, wherein the memory cells are multiple level cells.

Example 45

This example includes the elements of example 31, wherein the memory access time interval duration parameter is determined utilizing one or more trim-by-die operation(s).

Example 46

This example includes the elements of example 31, wherein the memory controller is further configured to determine a temperature adjustment parameter, associate the temperature adjustment parameter with the memory address identifier and store the temperature adjustment parameter to the parameter store.

Example 47

This example includes the elements of example 30, wherein the memory controller is further configured to determine the current operating temperature and to select a temperature adjustment parameter based, at least in part, on the memory address identifier, the adjusted memory access time interval duration parameter related to the temperature adjustment parameter.

Example 48

This example includes the elements of example 46 or 47, wherein the temperature adjustment parameter is related to a change in resistance with temperature of a coupling structure associated with the memory address identifier.

Example 49

This example includes the elements of example 46 or 47, wherein the temperature adjustment parameter comprises one or more of a temperature-dependent adjustment factor (AF(T)), a rate of change of coupling structure resistance with temperature ($\Delta R/\Delta T$), a temperature range related to $\Delta T$ and associated with the rate of change of coupling structure resistance, a scale factor (SF) associated with the rate of change of coupling structure resistance and/or a baseline operating temperature ($T_{nom}$).

Example 50

Another example of the present disclosure is a system including at least one device arranged to perform the method of any one of claims 15 to 25.

Example 51

Another example of the present disclosure is a device including means to perform the method of any one of claims 15 to 25.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus comprising:
    a memory controller configured to allow a target node in a memory array to transition from an initial state to a dwell state and back to the initial state by selecting a memory access time interval duration parameter based, at least in part, on a memory address identifier, in response to receiving a memory access request; to adjust the selected memory access time interval duration parameter based, at least in part, on a current operating temperature; and
    perform a requested memory access operation on the memory array, a duration of the memory access operation related to the adjusted memory access time interval duration parameter.

2. The apparatus of claim 1, wherein the memory controller is further configured to determine the memory access time interval duration parameter; associate the memory access time interval duration parameter with the memory address identifier; and store the memory access time interval duration parameter and the associated memory address identifier in a parameter store.

3. The apparatus of claim 2, wherein the memory controller is further configured to determine a temperature adjustment parameter, associate the temperature adjustment parameter with the memory address identifier and store the temperature adjustment parameter to the parameter store.

4. The apparatus of claim 1, wherein the memory controller is further configured to determine the current operating temperature and to select a temperature adjustment parameter based, at least in part, on the memory address identifier, the adjusted memory access time interval duration parameter related to the temperature adjustment parameter.

5. The apparatus of claim 1, wherein a memory access time interval comprises a precharge time interval configured to transition the target node from an initial state to a target state, a duration of the precharge time interval related to a coupling structure of the memory array.

6. The apparatus of claim 2, wherein the memory access time interval parameter is predetermined based, at least in part, on a coupling structure geometry of the memory array.

7. The apparatus of claim 2, wherein the memory access time interval parameter is determined iteratively, based, at least in part, on a number of trials of memory access operations.

8. A method comprising:
    allowing, by a memory controller, a target node in a memory array to transition from an initial state to a dwell state and back to the initial state by selecting, by the memory controller, a memory access time interval duration parameter based, at least in part, on a memory address identifier, in response to receiving a memory access request;

adjusting, by the memory controller, the selected memory access time interval duration parameter based, at least in part, on a current operating temperature; and performing, by the memory controller, a requested memory access operation on the memory array, a duration of the memory access operation related to the adjusted memory access time interval duration parameter.

9. The method of claim 8, further comprising:
determining, by the memory controller, the memory access time interval duration parameter;
associating, by the memory controller, the memory access time interval duration parameter with the memory address identifier; and
storing, by the memory controller, the memory access time interval duration parameter and the associated memory address identifier in a parameter store.

10. The method of claim 8, further comprising:
determining, by the memory controller, the current operating temperature; and
selecting, by the memory controller, a temperature adjustment parameter based, at least in part, on the memory address identifier, the adjusted memory access time interval duration parameter related to the temperature adjustment parameter.

11. The method of claim 9, further comprising:
determining, by the memory controller, a temperature adjustment parameter;
associating, by the memory controller, the temperature adjustment parameter with the memory address identifier; and
storing, by the memory controller, the temperature adjustment parameter to the parameter store.

12. The method of claim 11, wherein the temperature adjustment parameter is related to a change in resistance with temperature of a coupling structure associated with the memory address identifier.

13. The method of claim 8, wherein a memory access time interval comprises a precharge time interval configured to transition the target node from an initial state to a target state, a duration of the precharge time interval related to a coupling structure of the memory array.

14. The method of claim 8, wherein the memory array comprises a three dimensional memory architecture.

15. The method of claim 9, wherein the memory access time interval parameter is predetermined based, at least in part, on a coupling structure geometry of the memory array.

16. The method of claim 9, wherein the memory access time interval parameter is determined iteratively, based, at least in part, on a number of trials of memory access operations.

17. A system comprising:
a processor;
a chipset configured to couple the processor to a peripheral device;
a memory array comprising a plurality of memory cells; and
a memory controller configured to allow a memory cell in the memory array to transition from an initial state to a dwell state and back to the initial state by selecting a memory access time interval duration parameter based, at least in part, on a memory address identifier, in response to receiving a memory access request; to adjust the selected memory access time interval duration parameter based, at least in part, on a current operating temperature; and
perform a requested memory access operation on the memory array, a duration of the memory access operation related to the adjusted memory access time interval duration parameter.

18. The system of claim 17, wherein the memory controller is further configured to determine the memory access time interval duration parameter; associate the memory access time interval duration parameter with the memory address identifier; and store the memory access time interval duration parameter and the associated memory address identifier in a parameter store.

19. The system of claim 17, wherein the memory controller is further configured to determine a temperature adjustment parameter, associate the temperature adjustment parameter with the memory address identifier and store the temperature adjustment parameter to the parameter store.

20. The system of claim 17, wherein the memory controller is further configured to determine the current operating temperature and to select a temperature adjustment parameter based, at least in part, on the memory address identifier, the adjusted memory access time interval duration parameter related to the temperature adjustment parameter.

21. The system of claim 19, wherein the temperature adjustment parameter is related to a change in resistance with temperature of a coupling structure associated with the memory address identifier.

22. The system of claim 17, wherein a memory access time interval comprises a precharge time interval configured to transition a memory cell from an initial state to a target state, a duration of the precharge time interval related to a coupling structure of the memory array.

23. The system of claim 17, wherein the memory array comprises a three dimensional memory architecture.

24. The system of claim 18, wherein the memory access time interval parameter is predetermined based, at least in part, on a coupling structure geometry of the memory array.

25. The system of claim 18, wherein the memory access time interval parameter is determined iteratively, based, at least in part, on a number of trials of memory access operations.

* * * * *